(12) United States Patent
Legallais et al.

(10) Patent No.: US 12,338,545 B2
(45) Date of Patent: Jun. 24, 2025

(54) METHOD FOR PRODUCING A LAYER OF ALUMINUM NITRIDE (ALN) ON A STRUCTURE OF SILICON OR III-V MATERIALS

(71) Applicants: COMMISSARIAT A L'ENERGIE ATOMIQUE ET AUX ENERGIES ALTERNATIVES, Paris (FR); C.N.R.S., Paris (FR); UNIVERSITE GRENOBLE ALPES, Saint Martin d'Heres (FR)

(72) Inventors: Maxime Legallais, Grenoble (FR); Bassem Salem, Grenoble (FR); Thierry Baron, Grenoble (FR); Romain Gwoziecki, Grenoble (FR); Marc Plissonnier, Grenoble (FR)

(73) Assignees: COMMISSARIAT L'ENERGIE ATOMIQUE ET AUX ENERGIES ALTERNATIVES, Paris (FR); C.N.R.S., Paris (FR); UNIVERSITE GRENOBLE ALPES, Saint Martin d'Heres (FR)

( * ) Notice: Subject to any disclaimer, the term of this patent is extended or adjusted under 35 U.S.C. 154(b) by 0 days.

(21) Appl. No.: 17/905,125

(22) PCT Filed: Feb. 25, 2021

(86) PCT No.: PCT/EP2021/054721
§ 371 (c)(1),
(2) Date: Aug. 26, 2022

(87) PCT Pub. No.: WO2021/170739
PCT Pub. Date: Sep. 2, 2021

(65) Prior Publication Data
US 2023/0111123 A1 Apr. 13, 2023

(30) Foreign Application Priority Data
Feb. 27, 2020 (FR) .................................... 2001978

(51) Int. Cl.
*C30B 25/16* (2006.01)
*C23C 16/30* (2006.01)
(Continued)

(52) U.S. Cl.
CPC .......... *C30B 25/165* (2013.01); *C23C 16/303* (2013.01); *C23C 16/4408* (2013.01);
(Continued)

(58) Field of Classification Search
CPC ......... C30B 25/00; C30B 25/02; C30B 25/16; C30B 25/165; C30B 25/18; C30B 25/20;
(Continued)

(56) References Cited

U.S. PATENT DOCUMENTS

2007/0116887 A1* 5/2007 Faguet ................. C23C 16/515
700/121
2008/0284020 A1* 11/2008 Ishizaka ............... H01L 23/485
438/669
2013/0306978 A1* 11/2013 Chen ................. H01L 21/02381
438/478

OTHER PUBLICATIONS

Sippola, et al. publication entitled "Comparison of mechanical properties and composition of magnetron sputter and plasma enhanced atomic layer deposition aluminum nitride films," J. Vac. Sci. Technol. A, vol. 36, No. 5, pp. 051508-1 (2018). (Year: 2018).*
(Continued)

*Primary Examiner* — Kenneth A Bratland, Jr.
(74) *Attorney, Agent, or Firm* — Oblon, McClelland, Maier & Neustadt, L.L.P.

(57) ABSTRACT

A method for producing an aluminium nitride (AlN)-based layer on a structure with the basis of silicon (Si) or with the basis of a III-V material, may include several deposition
(Continued)

cycles performed in a plasma reactor comprising a reaction chamber inside which is disposed a substrate having the structure. Each deposition cycle may include at least the following: deposition of aluminium-based species on an exposed surface of the structure, the deposition including at least one injection into the reaction chamber of an aluminium (Al)-based precursor; and nitridation of the exposed surface of the structure, the nitridation including at least one injection into the reaction chamber of a nitrogen (N)-based precursor and the formation in the reaction chamber of a nitrogen-based plasma. During the formation of the nitrogen-based plasma, a non-zero polarisation voltage $V_{bias\_substrate}$ may be applied to the substrate.

18 Claims, 7 Drawing Sheets

(51) Int. Cl.
    *C23C 16/44*     (2006.01)
    *C23C 16/455*     (2006.01)
    *C30B 25/18*     (2006.01)
    *C30B 25/20*     (2006.01)
    *C30B 29/40*     (2006.01)
    *H01L 21/02*     (2006.01)

(52) U.S. Cl.
CPC ........ *C23C 16/45538* (2013.01); *C30B 25/18* (2013.01); *C30B 25/20* (2013.01); *C30B 29/406* (2013.01); *H01L 21/02381* (2013.01); *H01L 21/02389* (2013.01); *H01L 21/0254* (2013.01); *H01L 21/0262* (2013.01)

(58) Field of Classification Search
CPC ......... C30B 29/00; C30B 29/10; C30B 29/40; C30B 29/403; C30B 29/406; C23C 16/30; C23C 16/301; C23C 16/303; C23C 16/4408; C23C 16/455; C23C 16/45525; C23C 16/45527; C23C 16/45536; C23C 16/45538; C23C 16/45542; H01L 21/02381; H01L 21/02389; H01L 21/0254; H01L 21/0262
USPC ........ 117/84, 88–89, 92, 103, 105, 937, 952
See application file for complete search history.

(56) References Cited

OTHER PUBLICATIONS

Faraz, et al. publication entitled "Tuning material properties of oxides and nitrides by substrate biasing during plasma-enhanced atomic layer deposition on planar and 3D substrate topographies," Applied Materials & Interfaces, vol. 10, pp. 13158-13180 (2018). (Year: 2018).*
International Search Report and Written Opinion mailed on May 17, 2021 in PCT/EP2021/054721 filed on Feb. 25, 2021 (6 pages).
Sippola, Perttu et al. "Comparison of mechanical properties and composition of magnetron sputter and plasma enhanced atomic layer deposition aluminum nitride films" *Journal of Vacuum Science and Technology: Part A*, vol. 36, No. 5, Jul. 30, 2018, XP012230385, 11 pages.
Rontu, Ville et al. "Atomic layer deposition of AlN from $AlCl_3$ using $NH_3$ and Ar/ $NH_3$ plasma" *Journal of Vacuum Science and Technology: Part A*, vol. 36, No. 2, Jan. 18, 2018, XP012225637, 7 pages.
O'Leary, Stephen K. et al., "Steady-State and Transient Electron Transport Within the III-V Nitride Semiconductors, GaN, AlN, and InN: A Review" *Journal of Materials Science: Materials in Electronics*, vol. 17, No. 2, Feb. 2016, pp. 87-126, 1 page.
Wright, A.F. and Nelson, U.S., "Consistent structural properties for AlN, GaN, and InN" *Physical Review B*, vol. 17, No. 12, Feb. 2016, 1 page.
Faraz, Tahsin, et al., "Tuning Material Properties of Oxides and Nitrides by Substrate Biasing during Plasma-Enhanced Atomic Layer Deposition on Planar and 3D Substrate Topographies," *ACS Applied Materials & Interfaces*, vol. 10, No. 15, 2018, 23 pages.
Kot, Malgorzata, et al., "Comparison of plasma-enhanced atomic layer deposition AlN films prepared with different plasma sources," *Journal of Vacuum Science & Technology A: Vacuum, Surfaces, and Films*, vol. 37, No. 2, 2019, 13 pages.
Bermudez, V.M. et al., "The fundamental surface science of wurtzite gallium nitride," *Surface Science Reports*, vol. 72, No. 4, 2017, pp. 147-315, 1 page.

* cited by examiner

METHOD FOR PRODUCING A LAYER OF ALUMINUM NITRIDE (AlN) ON A STRUCTURE OF SILICON OR III-V MATERIALS

CROSS-REFERENCE TO RELATED APPLICATIONS

The present application is the national stage of international application PCT/EP2021/054721, filed on Feb. 25, 2021, and claims the benefit of the filing date of French Appl. No. 2001978, filed on Feb. 27, 2020.

TECHNICAL FIELD

The present invention relates to the production of an aluminium nitride (AlN)-based layer on a structure, such as a layer or nanostructures, with the basis of III-N and III-V materials, and preferably with the basis of gallium nitride (GaN). It has, for example, an advantageous application in the field of microelectronics and more specifically, the fields of power electronics, sensors and optoelectronics.

STATE OF THE ART

The multiple properties of aluminium nitride (AlN) such as its large band gap, its dielectric permittivity, its good temperature stability or also its piezoelectricity making this material particularly attractive for numerous applications in the field of sensors, optoelectronic components and also high-frequency and high-power components. More specifically, due to its crystalline structure which is close to gallium nitride (GaN), AlN is a particularly useful material for producing devices based on GaN.

For example, AlN can be used as a passivation layer and thus form, in the ideal case, a good quality AlN/GaN interface. For an application relative to producing GaN-based transistors, such as high electron mobility transistors (HEMTs), when this AlN passivation layer precedes the gate dielectric of the transistor, the quality of the AlN/GaN interface and of the AlN layer are thus determinant in the correct operation of these transistors. Indeed, the quality of the AlN/GaN interface and of the AlN layer directly affect the electric performances of the devices, such as the mobility of the electrons, hysteresis and also the threshold voltage.

Thus, for these types of applications linked to HEMTs, but also for numerous other applications, there is therefore a general need consisting of proposing a solution allowing to obtain an AlN/GaN interface and a high-quality AlN layer.

Chemical vapour deposition (CVD) or physical vapour deposition (PVD) techniques are commonly used for the production of AlN. Although the CVD technique from metal organic precursors (MOCVD) allows to achieve layers of excellent quality, it requires high deposition temperatures greater than 700° C. which does not allow to consider this technique during a method of integration with structures which have a limited thermal budget.

Physical vapour deposition (PVC) techniques have the disadvantage of generating uniformity and conformity problems.

In literature, plasma-enhanced atomic layer deposition (PEALD) appears as a technique which can be considered for producing AlN layers. Indeed, it is based on a self-limiting growth method, in which the material is deposited layer-by-layer. Generally, the PEALD technique consists of sequentially injecting aluminium, then nitride precursors, into the reaction chamber of a plasma reactor. To achieve this sequential growth, these reactions are repeated cyclically.

Despite the existence of these known CVD, PVD, PEALD deposition techniques, there remains a need consisting of proposing a solution allowing to improve the properties of an AlN/GaN interface and/or an AlN layer.

Generally, there remains a need consisting of proposing a solution allowing to improve the properties of an AlN layer deposited on a layer or nanostructures with the basis of silicon or with the basis of III-V materials, in particular with the basis of materials III-N and in particular with the basis of GaN.

An aim of the present invention consists of responding to at least one of these needs.

SUMMARY

To achieve this aim, according to an embodiment, a method for producing an aluminium nitride (AlN)-based layer on a structure with the basis of at least one of the following materials can be provided: silicon (Si) or a material taken from among the III-V materials. The method comprises several cycles carried out in a plasma reactor comprising a reaction chamber inside which is disposed a substate comprising the structure. Each cycle comprises at least the following steps:
 deposition of aluminium-based species on an exposed surface of the structure, the deposition step comprising at least one injection in the reaction chamber of an aluminium (Al)-based precursor reacting with the exposed surface of the structure,
 nitridation of the exposed surface of the structure, the nitridation step comprising at least one injection in the reaction chamber of a nitrogen-based precursor and the formation in the reaction chamber of a nitrogen-based plasma reacting with the exposed surface of the structure.

During the formation of the nitrogen-based plasma, a non-zero polarisation voltage $V_{bias\_substrate}$ is applied to the substrate.

Unexpectedly and particularly advantageously, the polarisation of the structure during the injection of the nitride-based precursor allows, on the one hand, to considerably improve the quality of the AlN layer and on the other hand, to improve the quality of the interface between this AlN layer and the structure with the basis of silicon or of a material taken from among the III-V materials. In particular, the obtaining of an AlN crystalline layer of this quality was fully unexpected. The method thus returns to the principle of PEALD-type depositions by modifying it to provide a polarisation voltage applied to the substrate during the nitridation step.

It will be noted that this method allows, further to the obtaining of an AlN layer of particularly high quality, to favour a crystallographic orientation (002). Thanks to this control of the polarisation of the substrate, the energy of the ions which arrive on the exposed surface of the substrate is fully controlled, which allows to modify the crystalline quality of AlN, in particular the crystalline orientation. This AlN layer can then be used as a primer layer followed by a deposition of the AlN by a relatively rapid deposition technique, such as a physical vapour deposition (PVD), for example.

For the preparation of a transistor, the active layer of which is with the basis of a III-V material, the method avoids, in particular, offsetting the threshold voltage to negative voltages, and improves the gradient under the threshold. The method is thus particularly advantageous for the preparation of transistors, in particular power transistors, having good electric properties. In particular, when the structure of made of GaN and is intended to form at least one part of a GaN-based device such as an HEMT, the method allows to considerably increase the performances of such devices.

This AlN layer can also be used as a passivation layer for LEDs with the basis of materials III-N.

The application of a polarisation voltage $V_{bias\_substrate}$ to the substrate allows to increase the energy of the ions of the plasma in a controlled manner and independently from the voltage $V_{plasma}$ induced by the source used to generate the nitrogen-based plasma. The effectiveness of the plasma treatment can thus be modulated in a controlled manner to further improve the properties of the interface obtained. The electric performances of the component are consequently improved.

Optionally, the method can further have at least any one of the following features which can be taken separately or in combination:

According to an example, the structure is silicon-based.

According to another example, the structure is with the basis of a material taken from among the III-V materials. According to an example, the material is taken from among the III-N materials. According to an example, the material is GaN. Thus, the structure is made of GaN or is GaN-based.

According to an example, the structure is a layer. It has, for example a face which extends over the whole of the wafer. It can have a flat face. Alternatively, it can mould the shape of reliefs which are underlying it.

According to another example, the structure cannot be a layer. It can comprise a nanostructure or a plurality of nanostructures. A nanostructure is a structure, of which at least one dimension is less than 1 millimetre and preferably less than 500 nm ($10^{-9}$ metres) and preferably less than 100 nm. A nanostructure can be three-dimensional (3D). It can, for example, be a terminal or a wire extending in a main direction perpendicular to a face of the support substrate and having, in a plane perpendicular to this main direction, a cross-section less than 1 millimetre, preferably less than 500 nm, and preferably less than 100 nm. The nanostructure can also be a trench or a ridge. It can also be a structure intended to form part or form a device such as a transistor or a micromechanical or electromechanical device (MEMS, NEMS, etc.) or also an optical or optoelectronic device (MOEMS, etc.). The nanostructure is punctual. It does not extend over the whole of the wafer. Thus, a face of the wafer extends mainly in a plane and nanostructures extend from this face and in a direction perpendicular to this plane. These nanostructure are therefore discontinuous.

According to an example, the absolute value of the polarisation voltage $|V_{bias\_substrate}|$ is less than or equal to 160 volts.

According to an example, the absolute value of the polarisation voltage $|V_{bias\_substrate}|$ is greater than or equal to 10 volts.

According to an example, which $|V_{bias\_substrate}|$ is between 10 volts and 130 volts and preferably $V_{bias\_substrate}$ is between −10 volts and −130 volts.

According to an example, $|V_{bias\_substrate}|$ is equal to 35 volts.

These $V_{bias\_substrate}$ values allow to obtain a quality of the particularly high AlN layer. Furthermore, unexpectedly, they induce a crystallographic orientation (002). This AlN layer of very high quality can then be used as a primer layer followed by an AlN deposition by PVD, for example. This layer can also be used as a passivation layer for LEDs with the basis of the materials III-N.

According to an example, the polarisation voltage $V_{bias\_substrate}$ is applied for at least 70%, and preferably 90%, of the duration $T_N$ of the formulation of the nitrogen-based plasma. According to an example, the polarisation voltage $V_{bias\_substrate}$ is applied for the whole duration $T_N$ of the formation of the nitrogen-based plasma.

According to an example, the duration $T_N$ of the formation of the nitrogen-based plasma is sufficient to allow the nitridation of the whole film formed on the surface of the structure.

According to an example, the polarisation voltage $V_{bias\_substrate}$ is not applied during the deposition of aluminium-based species. Preferably, the polarisation voltage $V_{bias\_substrate}$ is applied only during the nitrogen-based plasma. Alternatively, $V_{bias\_substrate}$ is applied during the whole cycle.

According to an example, the duration $T_N$ of the formation of the nitrogen-based plasma is greater than 7 seconds, preferably, $T_N$ is greater than or equal to 10 seconds, and preferably $T_N$=15 seconds. These values allow to obtain a particularly high quality of the AlN layer.

According to an example, each cycle comprises, at least one step of draining the reaction chamber, the draining step comprising the injection into the reaction chamber of a neutral gas, the at least one draining step being carried out at at least one and preferably at each of the following instants:

after the injection of the aluminium-based precursor and before the formation of the nitrogen-based plasma, and after the formation of the nitrogen-based plasma.

According to an example, each cycle comprises, at least one step of stabilising gases present in the reaction chamber, the stabilisation step being carried out at least at the following instant: before the formation of the nitrogen-based plasma. Preferably, after the draining step.

According to an example, the aluminium-based precursor (Al) is taken from among trimethylaluminium and aluminium trichloride.

According to an example, the injection duration $T_{Al}$ of the aluminium-based precursor is sufficient to saturate the exposed surface of the structure, e.g. of the GaN-based layer, preferably, $T_{Al}$ is greater than or equal to 20 ms, preferably $T_{Al}$ is around 50 ms.

According to an example, the nitrogen (N)-based precursor is taken from among:

a dinitrogen and dihydrogen ($N_2$—$H_2$) mixture,
ammoniac ($NH_3$),
an ammoniac ($NH_3$), dinitrogen and dihydrogen ($N_2$—$H_2$) mixture.

According to an example, during at least some cycles, and preferably during each cycle, the injection into the reaction chamber of an aluminium (Al)-based precursor is done before the injection into the reaction chamber of a nitrogen (N)-based precursor. Thus, the deposition of the aluminium film is done before the nitridation.

According to an example, during at least some of the cycles, and preferably during the first of said several cycles, the step of nitriding the exposed surface of the structure is carried out, before the injection step of the aluminium (Al)-based precursor.

According to an example, the method comprises at least ten cycles and preferably at least fifteen cycles. Preferably, it comprises at least one hundred cycles and preferably around five hundred cycles.

BRIEF DESCRIPTION OF THE FIGURES

The aims, objectives, as well as the features and advantages of the invention will emerge better from the detailed description of an embodiment of the latter, which is illustrated by the following accompanying drawings, wherein:

FIG. 3A illustrates measurements by spectrometry of X-rays of the environment N1s for different AlN depositions at different average polarisation voltages.

FIG. 3B illustrates the ratio of the atomic percentage of the contribution of nitrogen linked to aluminium N1s AlN with a contribution 'a' and with a contribution 'b' according to the average polarisation voltage.

Figure 1:
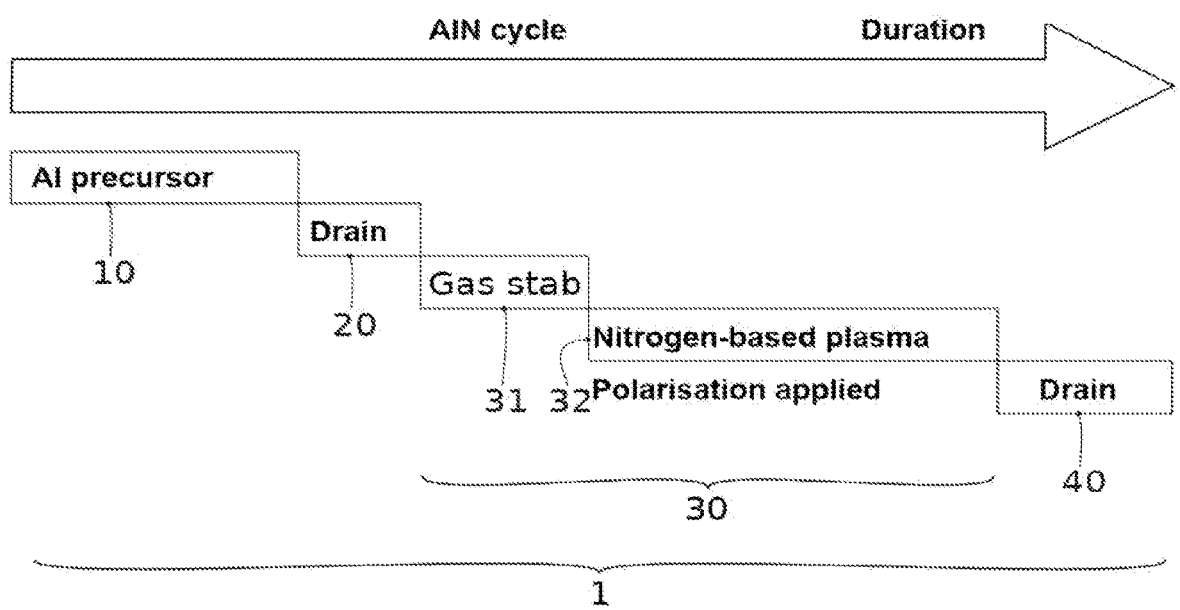
FIG. 1 schematically represents a cycle for forming an AlN film, according to an embodiment of the present invention.

The drawings are given as examples and are not limiting of the invention. They constitute principle schematic representations intended to facilitate the understanding of the invention and are not necessarily to the scale of practical applications. In particular, in FIG. 7A, the thicknesses of the different layers are not representative of reality.

DETAILED DESCRIPTION

By a substrate, a film, a layer, a gaseous mixture, a species A-"based" plasma, this means a substrate, a film, a layer, a gaseous mixture, a plasma comprising this species A only or this species A and possibly other species. Thus, a substrate comprising a structure such as a layer of nanostructures with the basis of Si or of III-V materials can be:

either, preferably, a stack comprising the structure with the basis of Si or of III-V material is a layer, typically a support layer on which the structure rests, or a stack comprising only the structure with the basis of Si or of III-V material. In this case, the structure can be self-supporting, i.e. that it supports its own weight.

Furthermore, a substrate with the basis of Si or of a III-V material also means a substrate of which the layer with the basis of Si or of III-V material is surmounted by one or more layers deposited during the method described below. Thus, an exposed surface of the substrate with the basis of Si or of the III-V material can be a surface formed by the structure or formed by one or more layers or films deposited on the structure.

Moreover, a nitrogen-based plasma can be based on a chemistry comprising only nitrogen or comprising nitrogen and possibly one or more other species, for example, neutral gases.

Fully conventionally, a structure with the basis of a III-V material is a structure made, or comprising a material comprising at least one species of the column III of the periodic table and at least one species of the column V of this table. Likewise, a structure with the basis of a III-N material is a structure made, or comprising a material comprising at least one species of the column III of the periodic table and of nitrogen (N). A III-N material can therefore, for example, be taken from among GaN, AlGaN, AlInGaN, InN.

Several embodiments of the invention implementing successive steps of the production method are described below. Unless explicitly otherwise mentioned, the adjective "successive" does not necessarily imply, even if this is generally preferred, that the steps immediately follow one another, intermediate steps which could separate them.

Moreover, the term "step" means the carrying out of a part of the method, and can mean a set of sub-steps.

Moreover, the term "step" does not compulsorily mean that the actions carried out during a step are simultaneous or immediately successive. Certain actions of a first step can in particular be followed by actions linked to a different step, and other actions of the first step can then be resumed. Thus, the term "step" does not necessarily mean single and inseparable actions over time and in the phase sequence of the method.

The word "dielectric" qualifies a material of which the electric conductivity is sufficiently low in the given application to be used as an insulator. In the present invention, a dielectric material preferably has a dielectric constant greater than 4. The spacers are typically formed of a dielectric material.

In the present patent application when a gaseous mixture is expressed with percentages, these percentages correspond to fractions of the total flow rate of the gases injected in the reactor. Thus, if a gaseous mixture, for example intended to form a plasma, comprises x % of the gas A, this means that the injection flow rate of the gas A corresponds to x % of the total flow rate of the gases injected into the reactor to form the plasma.

In the present invention, by "HEMT-type transistors" (High Electron Mobility Transistors), this means transistors with a high electron mobility field effect, sometimes also named by the term of heterostructure field effect transistor. Such a transistor includes the superposition of two semi-conductive layers having different band gaps which form a quantum well at their interface. Electrons are confined in this quantum well to form a two-dimensional electron gas. For reasons to hold at a high voltage and at a temperature, the materials of these transistors are chosen so as to have a wide energy band gap.

By microelectronic device, this means any type of device made with microelectronic means. These devices comprise, in particular, in addition to devices with a purely electronic purpose, micromechanical or electromechanical devices (MEMS, NEMS, etc.) as well as optical or optoelectronic devices (MOEMS, etc.).

This can be a device intended to ensure an electronic, optical, mechanical, etc. function. It can also be an intermediate product only intended to produce another microelectronic device.

It is specified that in the scope of the present invention, the thickness of a layer or of the substrate is measured in a direction perpendicular to the surface according to which this layer or this substrate has its maximum extension. The thickness is thus taken in a direction perpendicular to the main faces of the substrate on which the different layers rest.

It is specified that, in the scope of the present invention, the terms "on", "surmounts", "covers", "underlying", "opposite" and their equivalents do not necessarily mean "in contact with". Thus, for example, the deposition, the transfer, the gluing, the assembly or the application of a first layer on a second layer, does not compulsorily mean that the two layers are directly in contact with one another, but means that the first layer covers at least partially the second layer by being either directly in contact with it, or by being separated by it by at least one other layer or at least one other element.

The terms "substantially", "around", "about" mean "within 10%".

The general principle of the present invention will now be described in reference to FIG. 1.

FIG. 1 illustrates the different steps which intervene at each cycle of producing an AlN film on a structure with the basis of silicon or with the basis of a III-V material. This cycle of steps is repeated several times until the stack of these films forms an AlN layer having the desired thickness.

Each cycle comprises a sequential injection of precursors in a deposition plasma reactor such as that illustrated in FIG. 2 and which will be described below. Preferably, this is a reactor configured to perform depositions per atomic layer (PEALD). In order to proceed with these cycles, a substrate 70 comprising a structure with the basis of silicon or with the basis of a Ill-V material is disposed, in a reaction chamber of the reactor.

Such a structure is, for example, with the basis of a III-N material. In the non-limiting example which will now be described in detail, this structure is GaN-based. More specifically, this structure will be described as being a GaN layer. All the features, steps and technical effects which will be described below, are fully applicable to a structure with the basis of silicon or of a III-V material other than GaN. Moreover, all the features, steps and technical effects which will be described below are fully applicable to a structure, possibly other than a layer, such as a nanostructure, for example three-dimensional, or a plurality of such structures.

The substrate 70 can be formed only of this structure made of Si or made of III-V material. Alternatively, this substrate 70 can comprise a support layer surmounted at least by such a structure. The structure has a free surface, exposed to the species present in the reaction chamber.

Each cycle preferably comprises five main steps:

A first step consists of depositing 10 of the aluminium-based species on the exposed surface 70a of the structure forming or resting on the substrate 70. This step is referenced 10 in FIG. 1. This step comprises the injection into the reaction chamber of the reactor of an aluminium-based precursor. The aluminium-based reagent reacts with the exposed surface 70a by chemisorption.

If this injection is performed during the first cycle of producing the AlN layer, the exposed surface 70a is the upper face of a structure made of Si or made of III-V material, in this non-limiting example, a GaN layer. If this injection is performed during a subsequent cycle, the exposed surface 70a corresponds to the upper face of the AlN film formed during the preceding cycle or in formation during the current production cycle.

A second step, referenced 20, usually qualified as a drain has the function of discharging the reagents from the aluminium-based precursor which would not have reacted, as well as the reactional products. This drain generally consists of injecting a neutral gas such as argon (Ar) into the reaction chamber.

A third step, referenced 30 consists of performing a nitridation of the exposed surface 70a of the substrate 70. This step comprises the injection into the reaction chamber of a nitrogen (N)-based precursor, then the formation of a plasma 32 of which the chemistry comprises nitrogen-based species. This plasma is configured to allow the nitridation of the exposed surface 70a.

This third step 30, can comprise a stabilisation phase 31 of the gases used for the nitrogen-based plasma. This stabilisation phase 31 is preferably performed before the formation 32 of the nitrogen-based plasma.

During the formation 32 of the nitrogen-based plasma, a polarisation is applied on the structure with the basis of Si or of III-V material, in this example, a GaN-based layer. The voltage of this polarisation can be qualified from $V_{bias\_substrate}$, by differentiation with the voltage $V_{plasma}$ which is induced, fully conventionally by the source of the plasma in order to generate the ions and radicals and therefore initiating the dielectric deposition. The polarisation voltage $V_{bias\_substrate}$ is controlled independently from the voltage $V_{plasma}$ induced by the source.

In practice, the reaction chamber comprises a plate for receiving the substrate 70. The plate is electrically conductive and the polarisation voltage is applied to this plate, also called sample carrier, supporting the substrate 70. It can thus be said that this voltage is transmitted or applied to the substrate 70 and to the structure. It will be noted that, the expression "applied to the substrate" means that the polarisation voltage $V_{bias\_substrate}$ is applied to the plate on which the substrate 70 rests, that the substrate 70 is conductive or not.

Conventionally, in a remote plasma configuration, the plasma, generated by a main source (ICP or CCP), is far away from the substrate 70. A positive space charge zone called the sleeve is formed between the plasma and the substrate due to the different in mobility between heavy ions and electrons. This sleeve corresponds quite simply to the difference between the potential of the plasma $V_{plasma}$ and the potential of the substrate $V_{bias\_substrate}$. Thus, when no polarisation voltage on the substrate $V_{bias\_substrate}$ (at the ground), is applied, which is the standard case during depositions by PEALD, $V_{bias\_substrate}=0$. In the scope of the proposed method, a non-zero polarisation is applied on $V_{bias\_substrate}$, typically strictly less than 0 (<0). Therefore, the energy of the ions are increased/adjusted independently from $V_{plasma}$ since the energy of the ions indeed depends on the voltage of the plasma and of the polarisation voltage of the substrate $V_{bias\_substrate}$, according to the following ratio, with q the ion charge:

$$E_{ion}=q(V_{plasma}-V_{bias\text{-}substrate})$$

The application of this polarisation voltage $V_{bias\_substrate}$ provides considerable advantages. In particular, this polarisation allows to improve the quality of the formed AlN layer. On the other hand, it allows to improve the quality of the interface between the structure with the basis of Si or of III-V material and the AlN layer. FIGS. 3A to 7B, which will be described below in detail, explaining the advantages conferred by the application of this polarisation voltage during the step of forming 32 the nitrogen-based plasma.

By applying a non-zero polarisation voltage $V_{bias\_substrate}$, the effectiveness of the ion bombardment on the surface can be increased and adjusted, while preserving the exposed surface 70a. The quality of the AlN layer and the quality of the interface between this AlN layer and the substrate 70 are considerably improved. The repeatability of this method is further improved with respect to the current solutions, in particular those resorting to one single plasma source which allows to control only the ion flow reaching the substrate and therefore playing on $V_{plasma}$.

The polarisation voltage applied is less than 160 volts. It will be noted that this polarisation voltage is lower than the polarisation voltages usually used to perform plasma etchings or implantations. Furthermore, this method is preferably implemented in a deposition plasma reactor. Etching plasma reactors are not configured to apply as low polarisation voltages to the substrate.

Preferably, the polarisation voltage $V_{bias\_substrate}$ is applied only during the nitrogen-based plasma and not during the deposition of aluminium-based species. The alumina precursor (TMA, for example) is broken down thermally. Nitrogen itself requires a lot of energy and therefore requires a plasma to break it down. Consequently, it is possible to apply $V_{bias\_substrate}$ only during the nitrogen-based plasma. Alternatively, $V_{bias\_substrate}$ IS applied during the whole cycle.

A fourth step, referenced 40, consists of performing a drain so as to discharge the reagents of the nitrogen-based precursor which would not have reacted, as well as the reactional products. During this drain, neutral gas such as argon (Ar) is injected into the reaction chamber. This step, although advantageous, is only optional.

It will be noted in the method illustrated in FIG. 1, the injection of the aluminium-based precursor is performed before the injection of the nitrogen-based precursor and the formation 32 of the nitrogen-based plasma. However, it can be provided that the order of these groups of steps is inverted. Thus, the sequence comprising the injection of the aluminium-based precursor can be performed after the sequence comprising the injection and the formation of the nitrogen-based plasma 32.

Typically, coming from a cycle, the thickness of AlN formed is less than 1 Ångström ($10^{-10}$ metres). Preferably, this thickness is less than 0.7 Ångström. Preferably, this thickness is between 0.4 Ångström and 0.7 Ångström.

Figure 2:
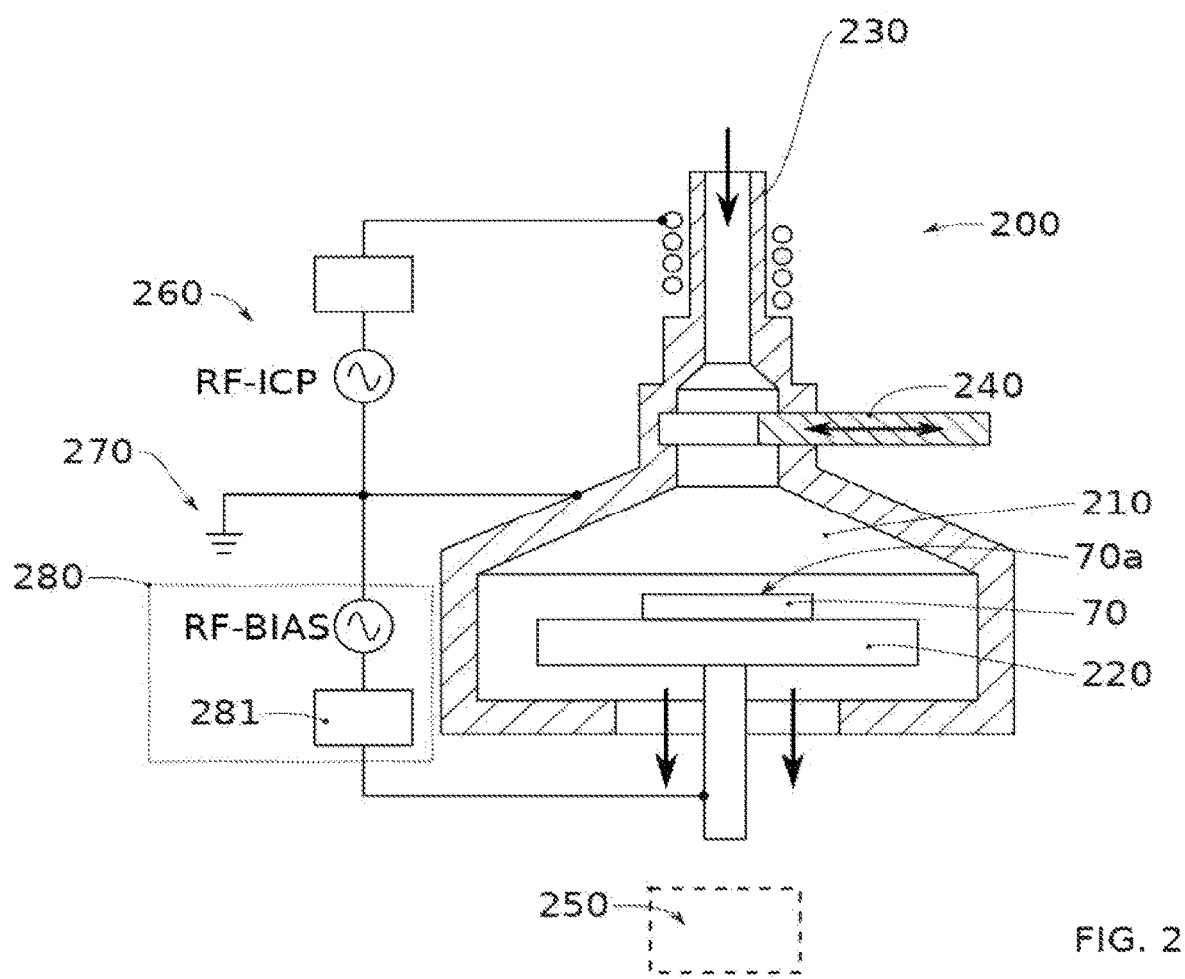
FIG. 2 schematically represents an example of a deposition reactor which could be used to implement the method according to the invention.

FIG. 2 illustrates a diagram of a plasma reactor which can be illustrated to implement the method proposed.

Preferably, the method proposed is implemented in a deposition plasma reactor. More specifically, in an inductive coupling plasma reactor, usually qualified by ICP (Inductively Coupled Plasma).

The reactor 200 comprises a reaction chamber 210 inside which the plate 220 is disposed. This plate 220 is configured to house the substrate 70 comprising GaN. The substrate 70 rests on the plate 220 by a rear surface. The front surface of the substrate 70, opposite its rear surface, is exposed to the species present in the reaction chamber 210. In this non-limiting example, the substrate 70 forms the structure on which the AlN-based layer is sought to be deposited. This front surface of the substrate 70 therefore constitutes the surface 70a of the structure. The plate 220 is electrically conductive. Relatively conventionally, the reactor comprises a gas inlet 230 allowing to inject gases inside the chamber 210, intended to form the chemistry of the plasma, as well as the gases intended for the drain phases. It also comprises an induction coupling device 260, a coil of which is illustrated in FIG. 2, and which allows the formation of the plasma. A wall of the reaction chamber 210 is electrically connected to the earth 270. Conventionally as this appears clearly in this FIG. 2, the plasma source 260 is remote with respect to the reaction chamber 210. Thus, the voltage $V_{plasma}$ is remote from the substrate 70. This polarisation voltage $V_{plasma}$ is not applied to the substrate 70. The reactor 200 also comprises an isolation valve 240 of the reaction chamber 210. The reactor 200 also comprises a pump 250 for extracting the species present in the reaction chamber 210.

More specifically, the method is implemented in an inductive coupling plasma reactor, usually qualified by ICP (Inductively Coupled Plasma). Preferably, the source is a radiofrequency inductive source, which allows to have a stable plasma at a lower power $P_{plasma}$ with respect to other sources, for example a microwave source, of typically 1500 W to 2000 W. According to an example, the power of the inductive radiofrequency source is between 100 and 300 W, preferably 300 W.

Advantageously, this reactor 200 comprises a polarisation device 280 configured to allow the application of the polarisation voltage $V_{bias\_substrate}$ to the plate 220. According to an example, this voltage can ultimately be applied to the substrate 70, at least at its rotated face facing the plate 220, that this face is electrically conductive or not. This polarisation device 280 comprises a control device 281 and allows to apply an alternating voltage on the plate 220. Preferably, this control device 281 comprises an automatic adaptation unit (qualified by auto match unit) which adapts the impedance in the chamber and the ion source to that of the radiofrequency generator.

This polarisation device 280 is configured to allow the application to the plate 220 of the polarisation voltage $V_{bias\_substrate}$ of which the amplitude is low, typically less than 160 volts, preferably less than 130 volts.

The polarisation device 280 and the plasma source 260 are configured so as to be able to adjust the polarisation voltage $V_{bias\_substrate}$ applied to the plate 220 independently of the plasma voltage $V_{plasma}$. $V_{bias\_substrate}$ and $V_{plasma}$ are independent. $V_{bias\_substrate}$ and $V_{plasma}$ are controlled independently.

In reference to FIGS. 3A to 7B, the effects and advantages of the application of a polarisation voltage during the formation of the nitrogen-based plasma will now be described in detail.

Figure 3A:
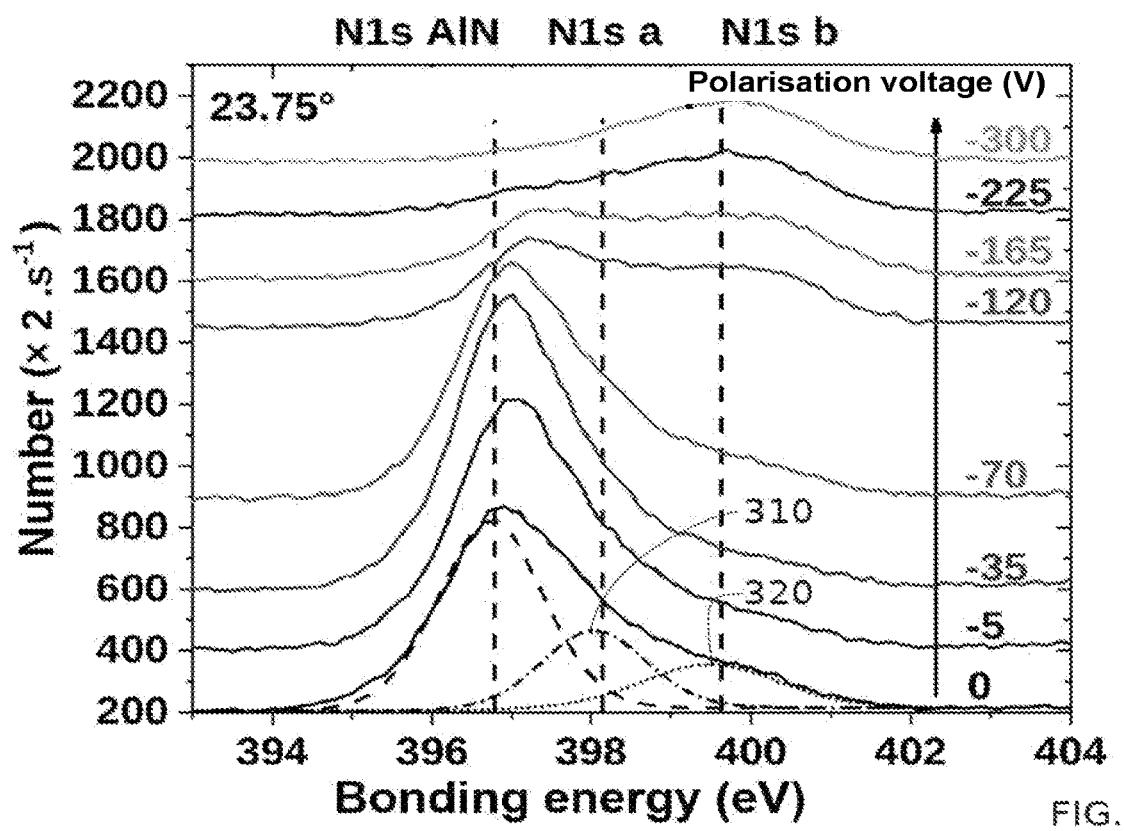
FIGS. 3A and 3B are graphs illustrating the effect of the polarisation of the substrate, during a nitrogen-based plasma, on the chemical environment of the nitrogen.
Figure 3B:
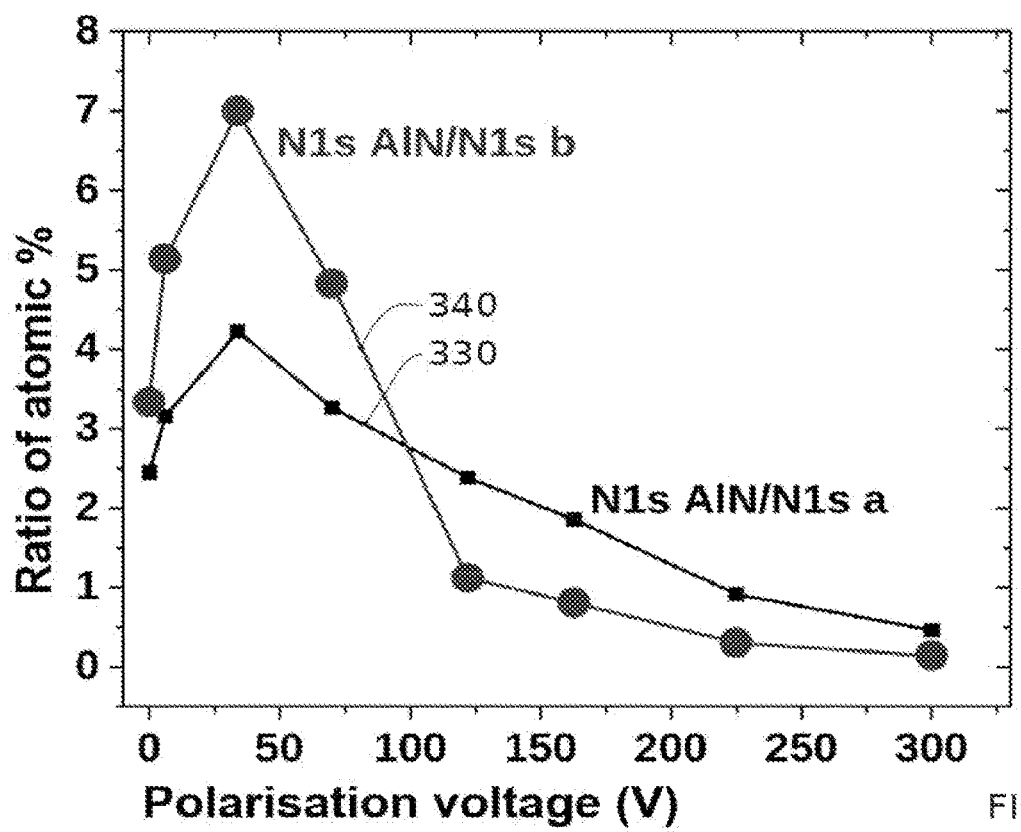

FIGS. 3A and 3B are graphs illustrating the effect of polarisation of the substrate, during a nitrogen-based plasma, on the chemical environment of the nitrogen. More specifically, in this example, the plasma is an $N_2$—$H_2$ plasma with 33% of hydrogen during the deposition of AlN on an orientation silicon layer (100).

FIG. 3A illustrates measurements by spectrometry of photoelectrons of X-rays of the environment N1s for different AlN depositions, made on an orientation silicon layer (100), this at different substrate polarisation voltages (V). Three contributions are observed. A first contribution corresponds to the N-Al bonds at around 396.7 eV. Two other contributions 'a' and 'b', undesired and corresponding to impurities, are observed. These contributions 'a' and 'b' are referenced 310 and 320.

FIG. 3B illustrates, on the curve 330, the ratio of the atomic percentage of bonds N1s with Al on the atomic percentage of bonds N1s with the contribution 'a'. The curve 340 of this FIG. 3B illustrates the ratio of the atomic percentage of bonds N1s with Al on the atomic percentage of bonds N1s with the contribution 'b'. The XPS (X-ray photoelectron spectrometry) analysis angle is 23.75°. According to these measurements by XPS, the ratio of the atomic percentage of the bonds N1s N—Al with respect to the other contributions 'a' and 'b' increases then decreases. This thus shows the quality of the layer can be improved with the polarisation of the substrate in a range of around 0 to −70V with an optimum emerging at around −35V. Similar results can be obtained with thicker layers of around 25 nm and also on a GaN layer instead of a silicon (Si) layer.

The duration of the nitrogen-based plasma must be sufficiently long to allow nitridation, preferably complete nitridation, of the surface exposed to the plasma and thus benefit from the effects of the polarisation of the substrate. Preferably, this duration of the plasma, referenced $T_P$ is greater than or equal to 70% and preferably greater than or equal to 90% of the duration $T_N$ of formation 32 of the nitrogen-based plasma. Preferably, $T_P=T_N$.

Figure 4A:
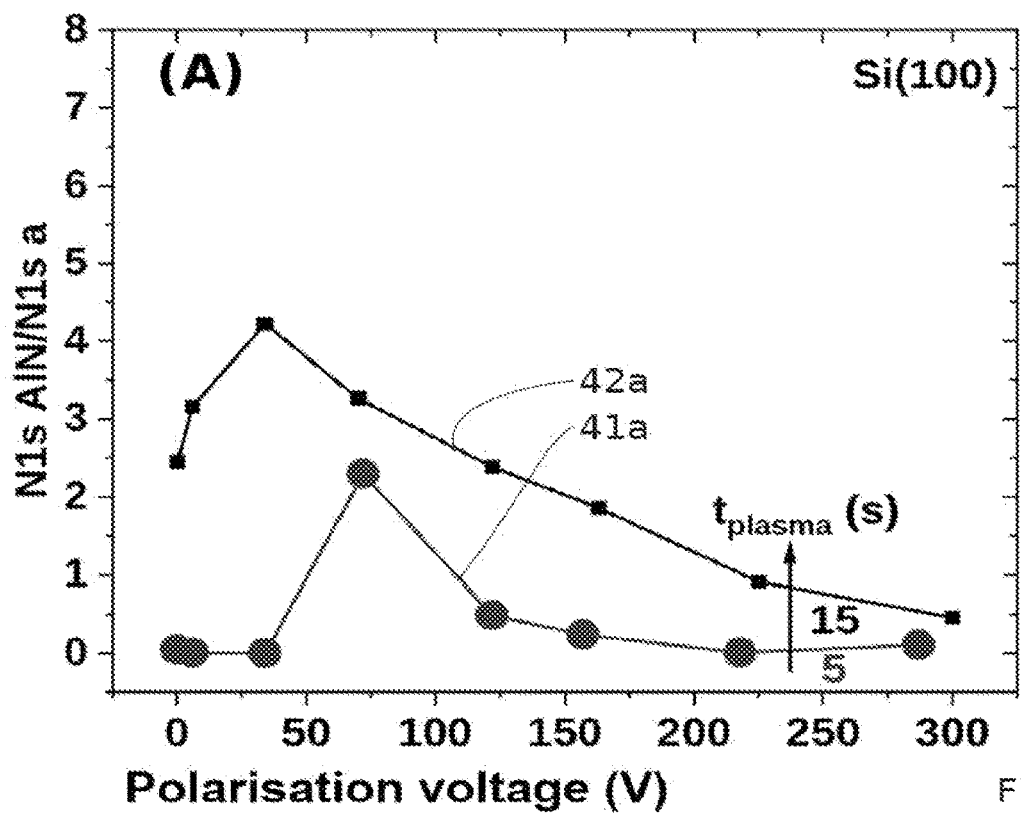
FIG. 4A illustrates the ratio of the atomic percentage of the contribution of nitrogen linked to aluminium N1s AlN with the contribution 'a' according to the average polarisation voltage and of the application duration of the polarisation.
Figure 4B:
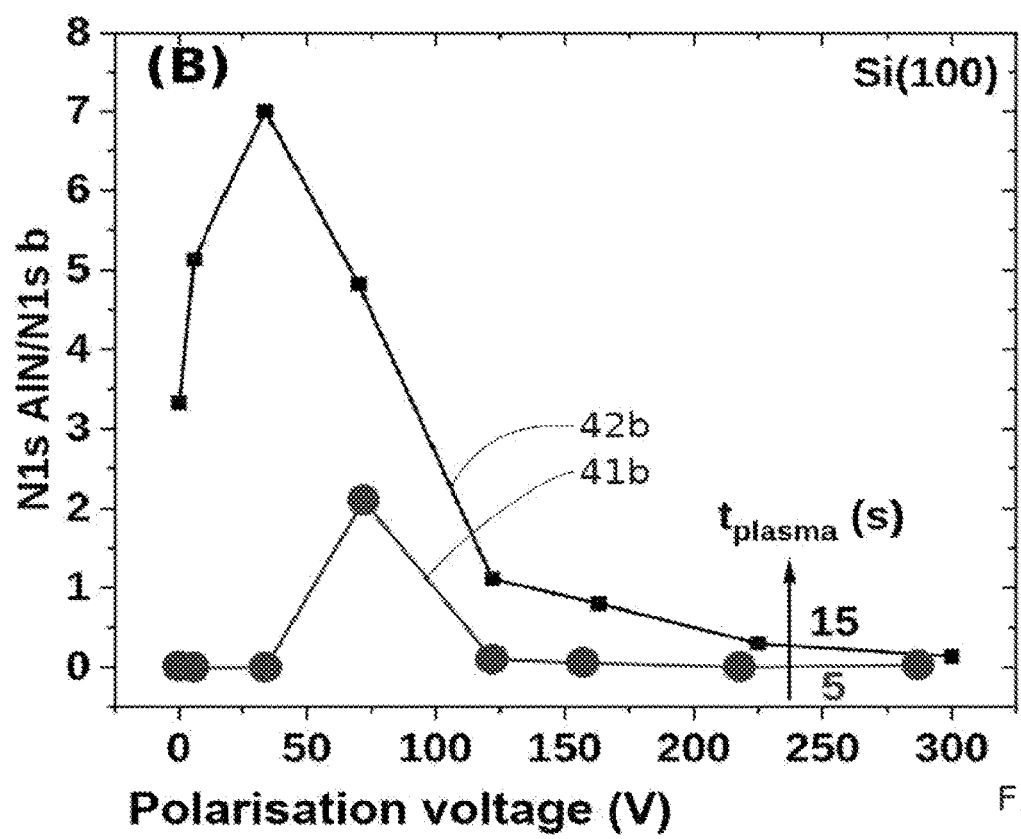
FIG. 4B illustrates the ratio of the atomic ratio of the contribution of nitrogen linked to aluminium N1s AlN with the contribution 'b' according to the average polarisation voltage and of the application duration of the polarisation.

FIGS. 4A and 4B illustrate, the ratio of the atomic percentage of the contribution of nitrogen linked to aluminium N1s AlN with the contribution 'a' (FIG. 4A) and with the contribution 'b' (FIG. 4B) according to the average polarisation voltage for a duration $T_P$ of 5s (seconds) (curves 41a and 41b) and for a duration $T_P$ of 15s (curves 42a and 42b), $T_P$ being the duration of the plasma, in this case a plasma based on a chemistry of $N_2$—$H_2$ with 33% of hydrogen.

It emerges from these figures that for a plasma $N_2$—$H_2$ with 33% of hydrogen, a plasma duration $T_P$ of 5s is too short, since it only forms very few AlN bonds. Thus, the polarisation of the substrate thus has little effect on the quality of the deposition if $T_P$ is not correctly adjusted.

Figure 5A:
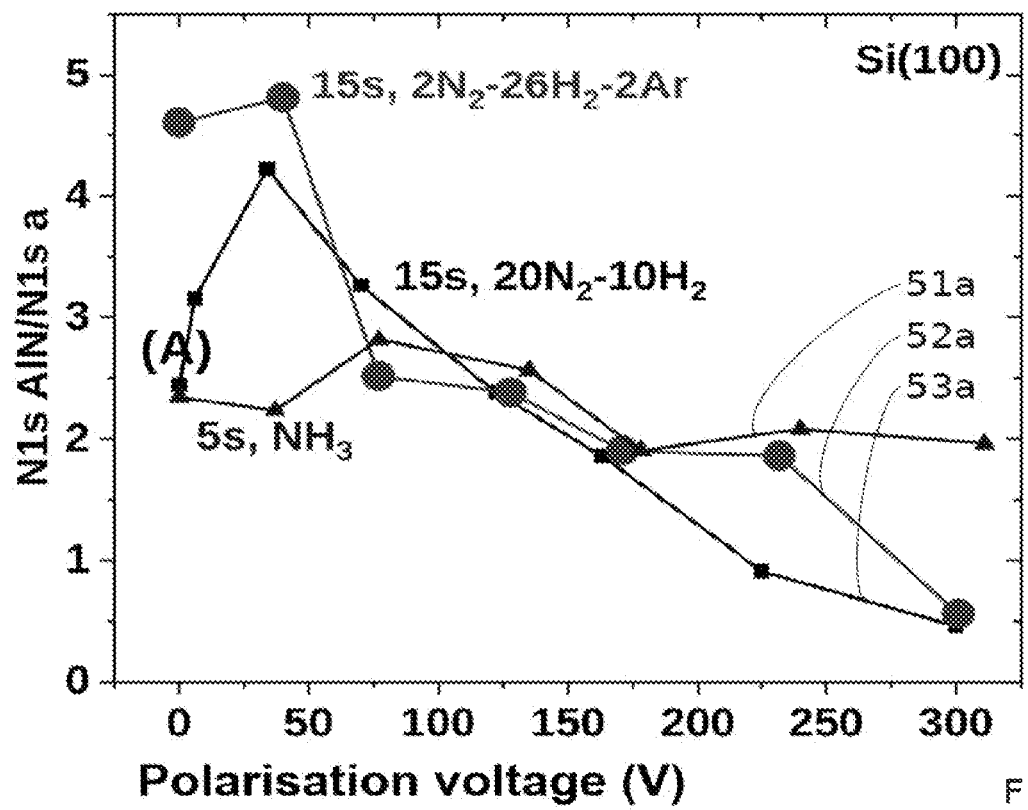
FIG. 5A illustrates the ratio of the atomic percentage of nitrogen linked to aluminium N1s AlN with the contribution 'a' according to the average polarisation voltage for different plasma chemistries and durations.
Figure 5B:
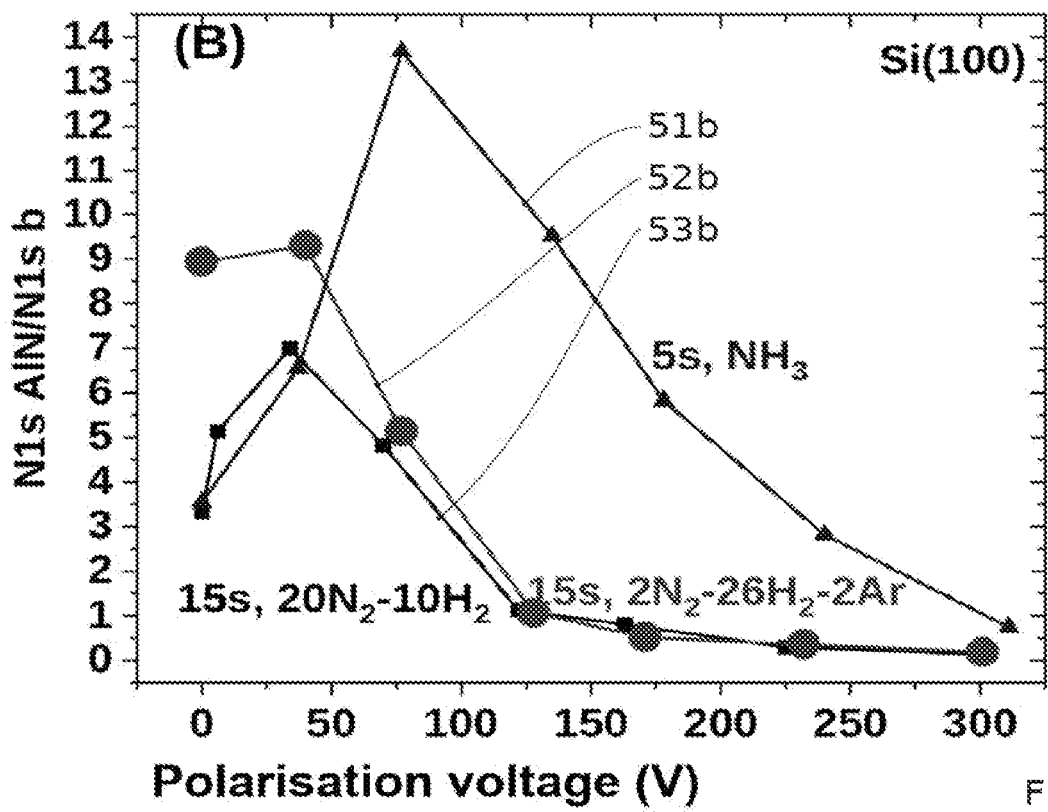
FIG. 5B illustrates the ratio of the atomic percentage of nitrogen linked to aluminium N1s AlN with the contribution 'b' according to the average polarisation voltage for different plasma chemistries and durations.

Similar results, illustrated in FIGS. 5A and 5B, have been obtained for depositions performed with three different chemistries, more specifically with respectively a $NH_3$ plasma, a $N_2$—$H_2$—Ar plasma, and also with a $N_2H_2$ plasma.

FIG. 5A illustrates the ratio of the atomic percentage of nitrogen linked to aluminium N1s AlN with the contribution 'a' according to the average polarisation voltage for different plasma chemistries and durations.

FIG. 5B illustrates the ratio of the atomic percentage of nitrogen linked to aluminium N1s AlN with the contribution 'b' according to the average polarisation voltage for different plasma chemistries and durations.

The curves 51a and 51b (key "5s, $NH_3$") each correspond to an ammoniac plasma only of a duration of 5s.

The curves 52a and 52b (key "15s, $N_2$—$H_2$—Ar") each correspond to a plasma composed of 86% of $H_2$, of 7% of $N_2$ and of 7% of Ar and of a duration of 15s.

The curves 53a, 53b (key "15s, $N_2$—$H_2$") each correspond to a plasma composed of 33% of hydrogen and of a duration of 15s.

Figure 6:
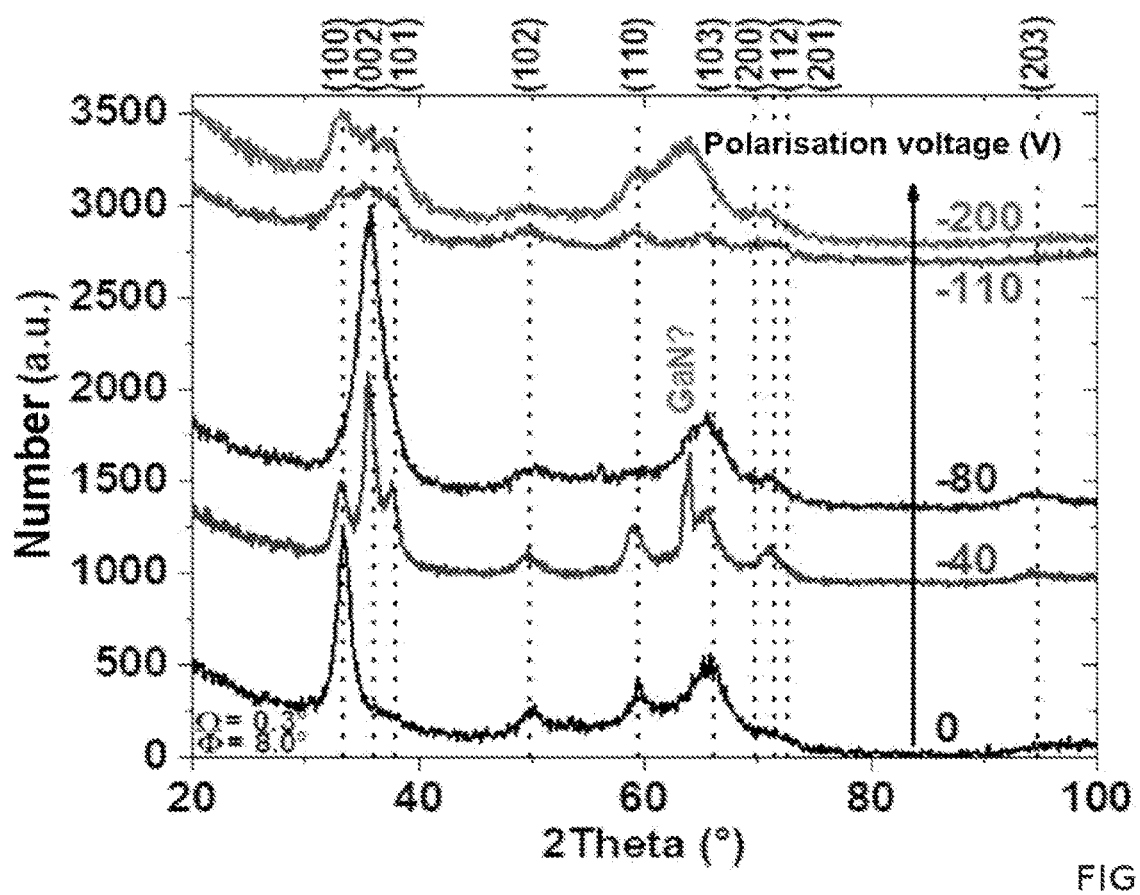
FIG. 6 illustrates the effect of polarisation on the crystallinity of the AlN deposited on a GaN substrate.

FIG. 6 illustrates the effect of polarisation of the crystallinity of the AlN deposited on the structure, in this case a GaN substrate. AlN depositions at different polarisation voltages have been performed on a GaN substrate. More specifically, in this example, the GaN substrates have been obtained by MOCVD-on-silicon growth.

In this example, the AlN layer is obtained by a succession of 500 cycles. Each cycle comprises a $N_2$—$H_2$ plasma (33% of hydrogen) maintained for a duration of 15 seconds. The X-ray diffraction measurements have been taken as a grazing incidence. The diffractogram has been indexed according to file ICDD 00-025-1133 of the hexagonal AlN.

The X-ray diffraction measurements as a grazing incidence show that the layers are polycrystalline and have a hexagonal structure. It is observed that a preferably growth orientation along the axis (002) appears to be favoured during the deposition at low polarisation voltages. Typically, these polarisation voltages are between −40V and −80V.

AlN depositions at different polarisation voltages have also been performed on a GaN substrate to study the effect induced by the application of a polarisation voltage on the electrical capacity features.

In this example, the doping of the GaN is of the N type. The doping is performed such that the concentration of doping species is $5 \times 10^{18}$ cm$^{-3}$.

Before their introduction into the PEALD reactor, the samples have been immersed in a 12% hydrochloric acid solution for 2 minutes then rinsed for 1 minute in deionised water and finally dried under a dinitrogen flow. Then, an AlN layer is formed by 40 cycles. For certain substrates, these cycles are performed without polarisation during the formation 32 of the nitrogen-based plasma (curves 701). For the other substrate, these cycles are performed with an average polarisation voltage of respectively −35V (curve 702), −70V (curve 703) and −130V (curve 704).

After this deposition, 125 alumina cycles ($Al_2O_3$) are deposited on the AlN layer. Preferably, this $Al_2O_3$ deposition is performed in one same reactor. Finally, circular terminals are defined in a photosensitive positive resin by lithography. Then, 30 nm of nickel then 100 nm of gold are evaporated by electron beam. Finally, the surplus metal is removed by lift-off in the acetone.

Figure 7A:
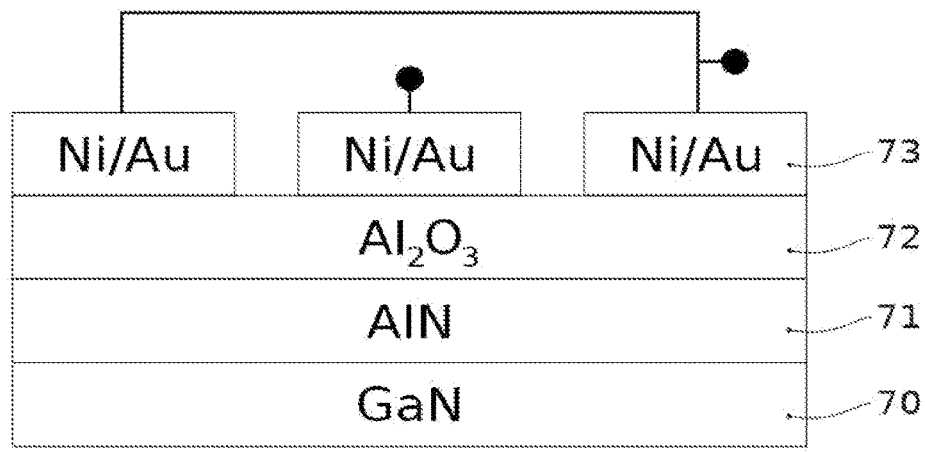
FIG. 7A is a diagram of a Metal-Insulator-Semi-conductor-type capacitive device comprising metal contacts (nickel/gold), an alumina layer, an AlN layer deposited without or with a polarisation voltage and surmounting a GaN layer.

FIG. 7A schematically illustrates the device obtained. This device comprises a GaN layer, for example forming a substrate 70 surmounted by an AlN layer 71 obtained by applying or not a polarisation voltage during successive deposition cycles. On and preferably directly in contact with the AlN layer 71, the $Al_2O_3$ layer 72 is found. The nickel and gold terminals 73 surmount the $Al_2O_3$ layer 72.

The different devices are characterised by "Capacitance-Voltage" (C-V)-type electric measurements at a frequency of 10 kHz and on a terminal size of 600 μm.

Figure 7B:
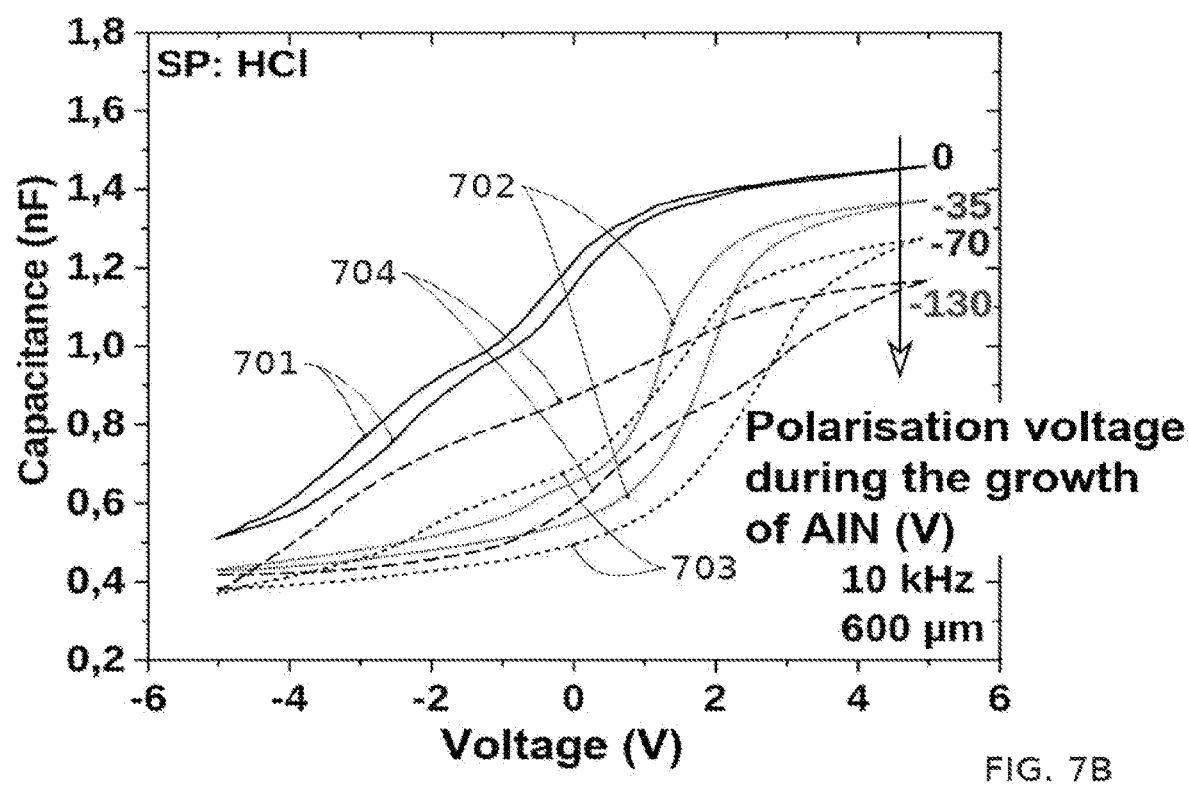
FIG. 7B is a graph illustrating Capacitance-Voltage (C-V) measurements for samples comprising an AlN layer deposited without polarisation (0V) and with an average polarisation voltage of −35V, −70V and −130V.

FIG. 7B illustrates the results of these electric measurements. The curves 701 correspond to the substrates obtained without applying polarisation voltage during formation cycles of the nitrogen-based plasma. The curves 702, 703 and 704 respectively correspond to the results obtained with substrates made by applying, during the formation of the nitrogen-based plasma, an average polarisation voltage, of −35V, −70V and −130V.

It has been observed that the application of the polarisation voltage to the substrate allows to change the charge plane to the interface between the GaN and the gate stack and allows to offset the threshold voltage to the positive voltages.

It emerges from this FIG. 7B that the polarisation of the substrate during the deposition of the AlN highly affects the electric features. Thanks to the substrate polarisation, the C-V features are offset to positive voltages, which is the desired effect in the scope of improving numerous devices and in particular, HEMTs. However, if the polarisation voltage is too high in absolute value, the switching between the depletion and accumulation regime is less abrupt and the hysteresis also increases (curves 704). An optimum thus emerges at an average polarisation voltage of −35V which corresponds to the optimum observed above for an $N_2$—$H_2$ plasma with 33% of hydrogen on XPS measurements as illustrated in FIGS. 3A and 3B.

Particular Examples and Embodiment Variants

The paragraphs below aim to describe particular embodiment examples of the present invention and to propose certain variants. The features and the examples and variants proposed below are applicable and can be combined with each of the examples mentioned above.

According to an embodiment, at least for certain cycles, the formation of the nitrogen-based plasma is performed before the injection of the aluminium-based precursor. Thus, steps 10 and 30 of FIG. 1 can be inverted. According to an embodiment, this sequence order is identical for all the cycles of forming the AlN layer.

According to an example, the drain phase uses a neutral gas such as dinitrogen ($N_2$) or argon (Ar). Advantageously, the drain duration is sufficiently high to remove excess reagent and/or subproducts from the reaction. Typically, the drain phase lasts several seconds. It lasts, for example, around 3s.

According to an example, the aluminium-based precursors can be trimethylaluminium or aluminium trichloride. The injection duration of the precursor must be sufficient to saturate the surface of the GaN-based layer or the already-deposited GaN surface. This injection duration is typically around 50 ms (10-6 seconds).

According to an example, the pressure of the reaction chamber of the reactor during the plasma must be adjusted so as to have a non-collisional sleeve. Typically, the pressure is less than 50 mTorr (that is 6.67 Pa) and preferably equal to 10 mTorr.

According to an example, the power RF-ICP must be sufficiently high to have a stable plasma. This power is greater than 100W. Preferably, this power is between 100-300W.

According to an example, the nitrogen-based precursor can be a dinitrogen and dihydrogen ($N_2$—$H_2$) mixture, ammoniac ($NH_3$), or a mixture of these gases. Argon can be added with all these gases.

According to an example, the duration of the nitrogen-based plasma must be sufficiently long to allow the nitridation of the film or of the layer previously formed.

According to an example, the polarisation voltage of the substrate during the nitrogen-based plasma is between −10V and −130V.

It clearly emerges from the description above, that the method proposed allows to considerably improve the quality of the deposited AlN layer, as well as the quality of the interface between the AlN and GaN.

The method proposed thus confers considerable advantages, in particular for the production of GaN- and AlGaN-based HEMT transistors.

The invention is not limited to the embodiments described above and extends to all the embodiments covered by the claims.

For example, in the preceding examples, the GaN-based layer on which the AlN-based layer is formed, is constituted of GaN. However, the present invention also extends to the embodiments in which the GaN-based layer on which the AlN-based layer is formed, a layer made of a gallium nitride and at least one from among indium and aluminium. Thus, this GaN-based layer can be GaN, AlGaN, InGaN or AlInGaN.

The invention also extends to the embodiments in which the structure on which the AlN layer is deposited, is silicon-based.

The invention also extends to the embodiments in which the structure on which the AlN layer is deposited is with the basis of a material taken from among the III-V materials. Preferably, this is a material III-N.

Thus, all the technical examples, features, steps and advantages above in reference to a GaN-based structure are applicable to a silicon-based structure or a material taken from among the III-V materials.

Moreover, in the examples described above, the structure is a layer. However, all the technical examples, features, steps and advantages mentioned above in reference to a structure forming a layer are applicable to a structure not forming a layer, but forming a punctual structure, for example a three-dimensional relief. The structure can be a nanostructure or comprise a plurality of nanostructures.

The invention claimed is:

1. A method for producing an AlN layer on a silicon-based or III-V material-based structure, the method comprising:

two or more deposition cycles performed in a plasma reactor comprising a reaction chamber inside which is disposed a substrate comprising the silicon-based or III-V material-based structure, wherein each deposition cycle comprises:

depositing an aluminum-based species on an exposed surface of the silicon-based or III-V material-based structure, the depositing comprising injecting an aluminum-based precursor into the reaction chamber; and nitriding the exposed surface of the silicon-based or III-V material-based structure, the nitriding comprising injecting a nitrogen (N)-based precursor into the reaction chamber and forming a nitrogen-based plasma in the reaction chamber, wherein a non-zero polarization voltage, as $V_{bias\_substrate}$, is applied to the substrate during the forming of the nitrogen-based plasma, wherein an absolute value of the non-zero polarization voltage, $|V_{bias\_substrate}|$, is in a range of greater than or equal to 35 Volts and less than or equal to 80 Volts, wherein the AlN layer is crystalline with a crystallographic orientation of (002), and wherein the range of the absolute value of the non-zero polarization voltage, $|V_{bias\_substrate}|$, favours the crystallographic orientation of (002).

2. The method of claim 1, wherein the $V_{bias\_substrate}$ is applied for at least 70 % of a whole duration, as $T_N$, of the forming nitrogen-based plasma.

3. The method of claim 2, wherein the $T_N$ of the forming of the nitrogen-based plasma is sufficient to allow the nitriding of the whole exposed surface of the structure.

4. The method of claim 1, wherein the $V_{bias\_substrate}$ is controlled independently from a plasma voltage, as $V_{plasma}$, induced by a source of the nitrogen-based plasma.

5. The method of claim 1, wherein each cycle further comprises:
    draining the reaction chamber, the draining comprising injecting a neutral gas into the reaction chamber,
    wherein the draining is carried out:
        (i) after the injecting of the aluminium-based precursor and before the forming of the nitrogen-based plasma; and/or
        (ii) after the forming of the nitrogen-based plasma.

6. The method of claim 1, wherein each cycle further comprises:
    stabilizing gases present in the reaction chamber,
    wherein the stabilizing is carried out at least:
        before the forming of the nitrogen-based plasma.

7. The method of claim 1, wherein the aluminum (Al)-based precursor comprises trimethylaluminum and/or aluminum trichloride.

8. The method of claim 1, wherein an injection duration, as $T_{Al}$, of the aluminum-based precursor is sufficient to saturate the exposed surface of the structure.

9. The method of claim 1, wherein the nitrogen-based precursor comprises:
    a dinitrogen and dihydrogen ($N_2$—$H_2$) mixture; or
    ammoniac ($NH_3$); or
    an ammoniac ($NH_3$), dinitrogen ($N_2$), and dihydrogen ($H_2$) mixture.

10. The method of claim 1, wherein during at least some of the cycles, the injecting of the aluminum-based precursor is performed before the nitriding.

11. The method of claim 1, wherein, during at least some of the cycles, the nitriding the exposed surface of the silicon-based or III-V material-based structure is carried out, before the injecting of the aluminum-based precursor.

12. The method of claim 1, wherein the silicon-based or III-V material-based structure comprises: a layer, a three-dimensional structure, or a plurality of three-dimensional structures.

13. The method of claim 1, wherein the silicon-based or III-V material-based structure is silicon-based.

14. The method of claim 1, wherein the silicon-based or III-V material-based structure is based on a III-V material.

15. The method of claim 14, where the silicon-based or III-V material-based structure is based on a III-N material.

16. The method of claim 15, wherein the silicon-based or III-V material-based structure is gallium nitride-based.

17. The method of claim 1, wherein the non-zero polarization voltage, as $V_{bias\_substrate}$, is not applied to the substrate during the depositing of the aluminum-based species.

18. A method for producing an AlN layer on a GaN-based structure, the method comprising:
    two or more deposition cycles performed in a plasma reactor comprising a reaction chamber inside which is disposed a substrate comprising the GaN-based structure,
    wherein each deposition cycle comprises:
    depositing an aluminum-based species on an exposed surface of the GaN-based structure, the depositing comprising injecting an aluminum-based precursor into the reaction chamber; and
    nitriding the exposed surface of the GaN-based structure, the nitriding comprising injecting a nitrogen (N)-based precursor into the reaction chamber and forming a nitrogen-based plasma in the reaction chamber,
    wherein a non-zero polarization voltage, as $V_{bias\_substrate}$, is applied to the substrate during the forming of the nitrogen-based plasma,
    wherein an absolute value of the non-zero polarization voltage, $|V_{bias\_substrate}|$, is in a range of greater than or equal to 35 Volts and less than or equal to 80 Volts,
    wherein each deposition cycle deposits an AlN layer thickness of between 0.4 and 0.7 Å,
    wherein the AlN layer is crystalline with a crystallographic orientation of (002),
    wherein the range of the absolute value of the non-zero polarization voltage, $|V_{bias\_substrate}|$, favours the crystallographic orientation of (002),
    wherein the aluminum-based precursor comprises trimethylaluminum and/or aluminum trichloride, and
    wherein the nitrogen-based precursor comprises:
    a dinitrogen and dihydrogen ($N_2$—$H_2$) mixture; or
    ammoniac ($NH_3$); or
    an ammoniac ($NH_3$), dinitrogen ($N_2$), and dihydrogen ($H_2$) mixture.

* * * * *